United States Patent
Hwang et al.

(10) Patent No.: US 7,063,989 B2
(45) Date of Patent: Jun. 20, 2006

(54) METHOD OF ALIGNING A SEMICONDUCTOR SUBSTRATE WITH A SEMICONDUCTOR ALIGNMENT APPARATUS

(75) Inventors: Sun-Lee Hwang, Yongin-si (KR);
Sung-Soo Park, Suwon-si (KR);
Won-Sub Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 252 days.

(21) Appl. No.: 10/805,225

(22) Filed: Mar. 22, 2004

(65) Prior Publication Data

US 2004/0185581 A1    Sep. 23, 2004

(30) Foreign Application Priority Data

Mar. 20, 2003    (KR) ...................... 10-2003-0017597

(51) Int. Cl.
*H01L 21/00* (2006.01)
*G01B 11/00* (2006.01)

(52) U.S. Cl. .............................. 438/5; 438/14; 438/462; 356/399

(58) Field of Classification Search ...................... None
See application file for complete search history.

(56) References Cited

U.S. PATENT DOCUMENTS

| 4,780,288 | A | | 10/1988 | Aughwane | 422/257 |
|---|---|---|---|---|---|
| 5,851,848 | A | * | 12/1998 | Balamurugan | 438/33 |
| 6,016,358 | A | * | 1/2000 | Balamurugan | 382/151 |
| 6,028,664 | A | * | 2/2000 | Cheng et al. | 356/237.4 |
| 6,084,678 | A | * | 7/2000 | Matsuura | 356/401 |
| 6,216,055 | B1 | * | 4/2001 | Balamurugan et al. | 700/121 |
| 6,228,743 | B1 | * | 5/2001 | Chen et al. | 438/401 |
| 6,242,318 | B1 | * | 6/2001 | Mugibayashi et al. | 438/401 |
| 6,259,525 | B1 | * | 7/2001 | David | 356/399 |
| 6,400,038 | B1 | * | 6/2002 | Mugibayashi et al. | 257/797 |
| 6,716,649 | B1 | * | 4/2004 | Ziger | 438/14 |
| 6,897,956 | B1 | * | 5/2005 | Noguchi et al. | 356/401 |
| 6,963,389 | B1 | * | 11/2005 | Fukada | 355/53 |

FOREIGN PATENT DOCUMENTS

JP          2002237446 A    *    8/2002

* cited by examiner

*Primary Examiner*—Alonzo Chambliss
(74) *Attorney, Agent, or Firm*—Volentine Francos & Whitt, PLLC

(57) ABSTRACT

A semiconductor substrate is mounted on a semiconductor alignment apparatus. A chip alignment step is performed to center a central chip on the semiconductor substrate with respect to the semiconductor alignment apparatus, and to store the coordinates thereof. A semiconductor substrate alignment is performed to virtually align the semiconductor substrate with the semiconductor alignment apparatus. At this time, coordinates of a chip adjacent to the central chip and of a number of chips in a peripheral region of the semiconductor substrate are stored in the alignment apparatus. In addition, at least two templates are located in the central chip, and images and coordinates of the templates are stored in the semiconductor alignment apparatus during the semiconductor substrate alignment.

6 Claims, 7 Drawing Sheets

METHOD OF ALIGNING A SEMICONDUCTOR SUBSTRATE WITH A SEMICONDUCTOR ALIGNMENT APPARATUS

BACKGROUND OF THE INVENTION

1. Field of the Invention

The present invention relates to the aligning of a semiconductor substrate in preparation for a semiconductor manufacturing or test process.

2. Field of the Invention

In general, a semiconductor substrate is aligned using a semiconductor alignment apparatus before the substrate is processed or tested. In particular, semiconductor alignment apparatus are typically used in a stepper or a scanner of photolithographic equipment, and in semiconductor device test equipment comprising a tester and a probe card mounted thereon. In addition, semiconductor alignment apparatus have been continuously upgraded to precisely recognize information concerning the semiconductor substrate and the chips thereon. These upgrades are in line with the overall manufacturing goal of yielding a number of good chips from the semiconductor substrate.

Photolithography is used to form a number of such chips on the semiconductor substrate by producing a series of overlapping patterns on the substrate. Thus, the substrate must be precisely aligned with the photolithographic equipment if the patterns are to be formed properly relative to one another. On the other hand, the tester tests a semiconductor device by sending electrical signals to the semiconductor chip or receiving electrical signals from the semiconductor chip through the probe card. To this end, the probe card includes a plurality of pins that are to contact respective pads on the semiconductor substrate. Therefore, the semiconductor substrate must be aligned with the tester to obtain proper contact between the semiconductor device and the probe card.

Furthermore, conventional semiconductor alignment apparatus select and use one template for aligning the semiconductor substrate in preparation for the semiconductor manufacturing or test process. The template is a pattern of high discriminating power, and can be easily found by the semiconductor alignment apparatus at one of the chips of the semiconductor substrate.

However, due to discrepancies related to their manufacturing process, those templates among the respective chips on a semiconductor substrate or among the respective semiconductor substrates may have different discriminating powers. If the semiconductor alignment apparatus picks up an image of a template having a low discriminating power in the course of an alignment process, the semiconductor substrate may be transferred back to a cassette. Thus, the manufacturing process is delayed, thereby adding to the unit cost of production.

U.S. Pat. No. 4,870,288 to Abuku et al. discloses an alignment method comprising the steps of finding a template at the region of a selected chip of a semiconductor substrate, reading the template to obtain coordinates of the location of the selected chip and of the other chips on the semiconductor substrate, and using the coordinates to align the semiconductor substrate. More specifically, the coordinates are used to derive correction values. The correction values are added to the original coordinates to adjust the location of the semiconductor substrate relative to the semiconductor device manufacturing equipment, for example. However, the accuracy of the method is highly dependent on the (template) manufacturing process or on the exterior environment because the method uses only one template. Thus, the method can be accompanied by delays and is prone to producing alignment errors.

SUMMARY OF THE INVENTION

An object of the present invention is to provide an alignment method that is not subject to the problems and disadvantages of the prior art.

More specifically, an object of the present invention is to provide an alignment method for use in aligning a semiconductor substrate in preparation for processing or testing, which is not prone to producing delays associated with an alignment failure.

First, the semiconductor substrate is placed on a chuck (wafer stage) of the semiconductor alignment apparatus.

Then, a checker of the semiconductor alignment apparatus is positioned a predetermined distance above a central (reference) chip of the semiconductor substrate. Next, the checker is used to find the center of the central chip of the semiconductor substrate. To this end, the semiconductor substrate has keys at four corners of a scribe line surrounding each of the respective chips. The alignment ruler is sequentially juxtaposed with the respective keys in the scribe line surrounding the central chip. Accordingly, coordinates of the location of the center of the central chip of the semiconductor substrate can be derived. Also, at this time, values representing the relative overlapping positions between the alignment ruler and the respective keys have a certain distribution. A substrate alignment step is performed once the 3 σ value of this distribution is within a predetermined range.

The semiconductor substrate alignment step is performed using the central chip on the semiconductor substrate and the checker. In this respect, at least two templates, formed in the center chip, are selected and images and coordinates of the at least two templates are stored in the semiconductor alignment apparatus. The templates can be easily found in the central chip by the checker because the templates comprise patterns of high discriminating power in comparison with neighboring patterns. The discriminating power refers to the degree to which a pattern can be resolved by the image recognition device (camera) of the checker.

The selection of the at least two templates is to prevent an alignment failure from occurring in the semiconductor alignment apparatus. For example, during the semiconductor test process, a tester passes among chips on the semiconductor substrate by using the image and coordinates of one of the at least two templates in the center chip. However, the discriminating power of the template may have deteriorated at some time during the course of the manufacturing process. If this is the case, an alignment failure occurs between the semiconductor alignment apparatus and the semiconductor substrate. In that case, the semiconductor alignment apparatus selects another of the at least two templates. Accordingly, the semiconductor test process can be performed without the interruption normally produced as the result of an alignment failure, e.g., without the semiconductor substrate being extracted from the semiconductor alignment apparatus under the direction of a program stored in the tester.

Next, the semiconductor substrate alignment step adjusts, i.e., defines, the relative locations of the central chip and the respective other chips on the semiconductor substrate. More specifically, a chip adjacent to the central chip on the semiconductor substrate is selected and used to obtain a location correction value representing a rotational and longitudinal/lateral deviation between the semiconductor substrate and the semiconductor alignment apparatus. After the location correction value is obtained, the semiconductor substrate is moved relative to the checker to find the coordinates of chips in a peripheral region of the semiconductor substrate. The correction value is added to the coordinates of these peripheral chips. As a result, the reference coordinates of the respective chips on the semiconductor substrate and the reference coordinate of the center of the semiconductor substrate on the chuck of the semiconductor alignment apparatus are decided. On this basis, a location correction is performed by comparing the coordinates of the central chip and the center of the semiconductor substrate obtained in the chip alignment step. A value that is obtained through the location correction corresponds to the center recognized by the semiconductor alignment apparatus. The center recognized by the semiconductor alignment apparatus is the center of the chuck (wafer stage).

After the coordinates of the respective centers of the central chip and the semiconductor substrate are corrected, an alignment between the semiconductor alignment apparatus and the semiconductor substrate is completed. The semiconductor substrate alignment apparatus is now prepared for facilitating the semiconductor manufacturing process or the semiconductor test process.

Thus, according to one aspect of the invention, the method comprises mounting a semiconductor substrate on a semiconductor alignment apparatus, performing a chip alignment step using the semiconductor alignment apparatus to obtain coordinates of a central chip, and performing a semiconductor substrate alignment step in which the image and coordinates of at least two templates are employed, and coordinates of chips on the semiconductor substrate are corrected relative to the alignment apparatus. Accordingly, the semiconductor substrate is rotationally and longitudinally/laterally aligned with the semiconductor alignment apparatus through the chip alignment step and the semiconductor substrate alignment step.

BRIEF DESCRIPTION OF THE DRAWINGS

These and other objects, features and advantages of the invention will be more readily apparent from the detailed description that follows made in conjunction with the accompanying drawings, in which.

DETAILED DESCRIPTION OF THE PREFERRED EMBODIMENT

The preferred embodiments of a method of aligning a semiconductor substrate according to the present invention will now be described in more detail with reference to the accompanying drawings.

Figure 1:
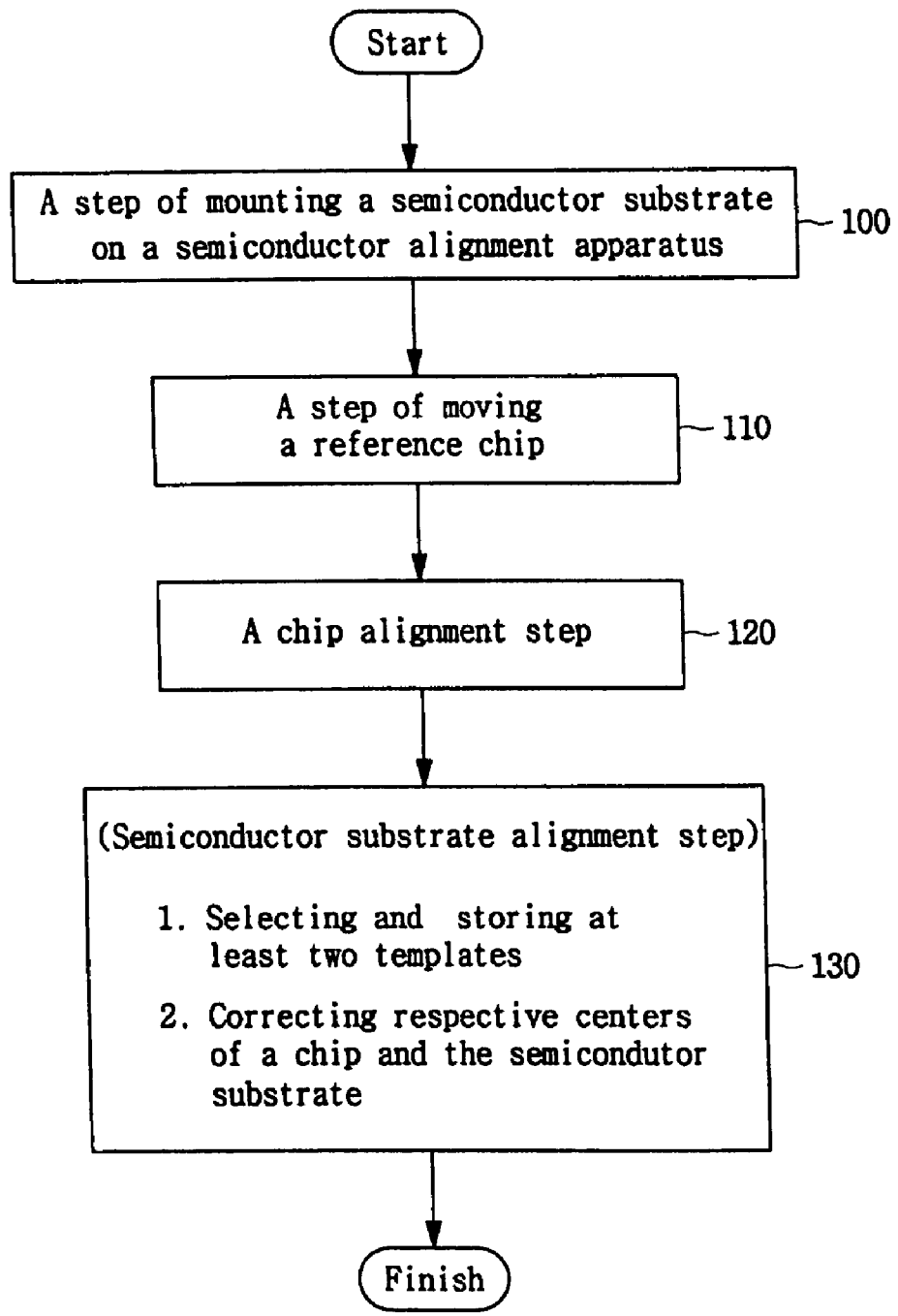
FIG. 1 is a flow chart of a first embodiment of a method of aligning a semiconductor substrate according to the present invention.

Referring first to FIG. 1, a first embodiment of the method includes a step 100 of mounting a semiconductor substrate on a semiconductor alignment apparatus, a step 110 of moving a checker to a reference chip, a chip alignment step 120, and a semiconductor substrate alignment step 130. The semiconductor substrate alignment step 130 comprises selecting and storing at least two templates, and rectifying respective centers of the central (reference) chip and the semiconductor substrate. These steps will now be described in more detail.

Figure 3:
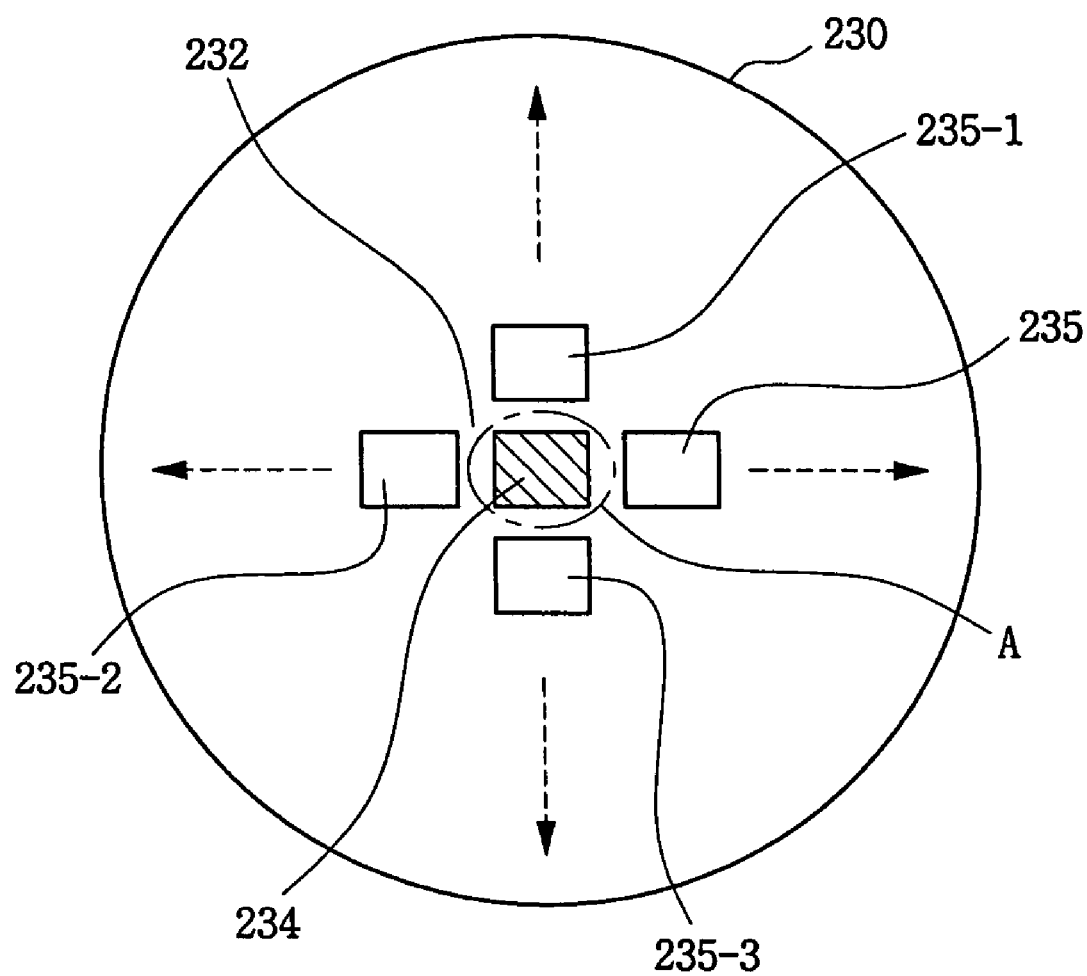
FIG. 3 is a plan view of a semiconductor substrate, illustrating a chip alignment step according to the invention.

Referring to FIG. 3, a checker of the semiconductor alignment apparatus is positioned over the central chip 234 of the semiconductor substrate 230 (step 110). The checker includes an alignment ruler, an image sensor and a camera. The checker thus has image recognition capability so as to enable it to recognize the semiconductor substrate and the chips formed thereon.

The central chip 234 is longitudinally/laterally surrounded by neighboring chips 235, 235-1, 235-2 and 235-3. The chips 234, 235, 235-1, 235-2 and 235-3 are spaced apart from one another by a certain pitch in each of the longitudinal and lateral directions. The pitch corresponds to the sum of a respective width of a chip (in the longitudinal or lateral direction) and the width of a scribe line 232. The value of the pitch is inputted and stored in the semiconductor alignment apparatus during the chip alignment step 120. In addition, the total number of chips formed on the semiconductor substrate 230 are also inputted and stored in the semiconductor alignment apparatus. Therefore, the coordinates of the central chip 234 become the basis for the coordinates of the other chips formed on the semiconductor substrate 230.

Figure 4:
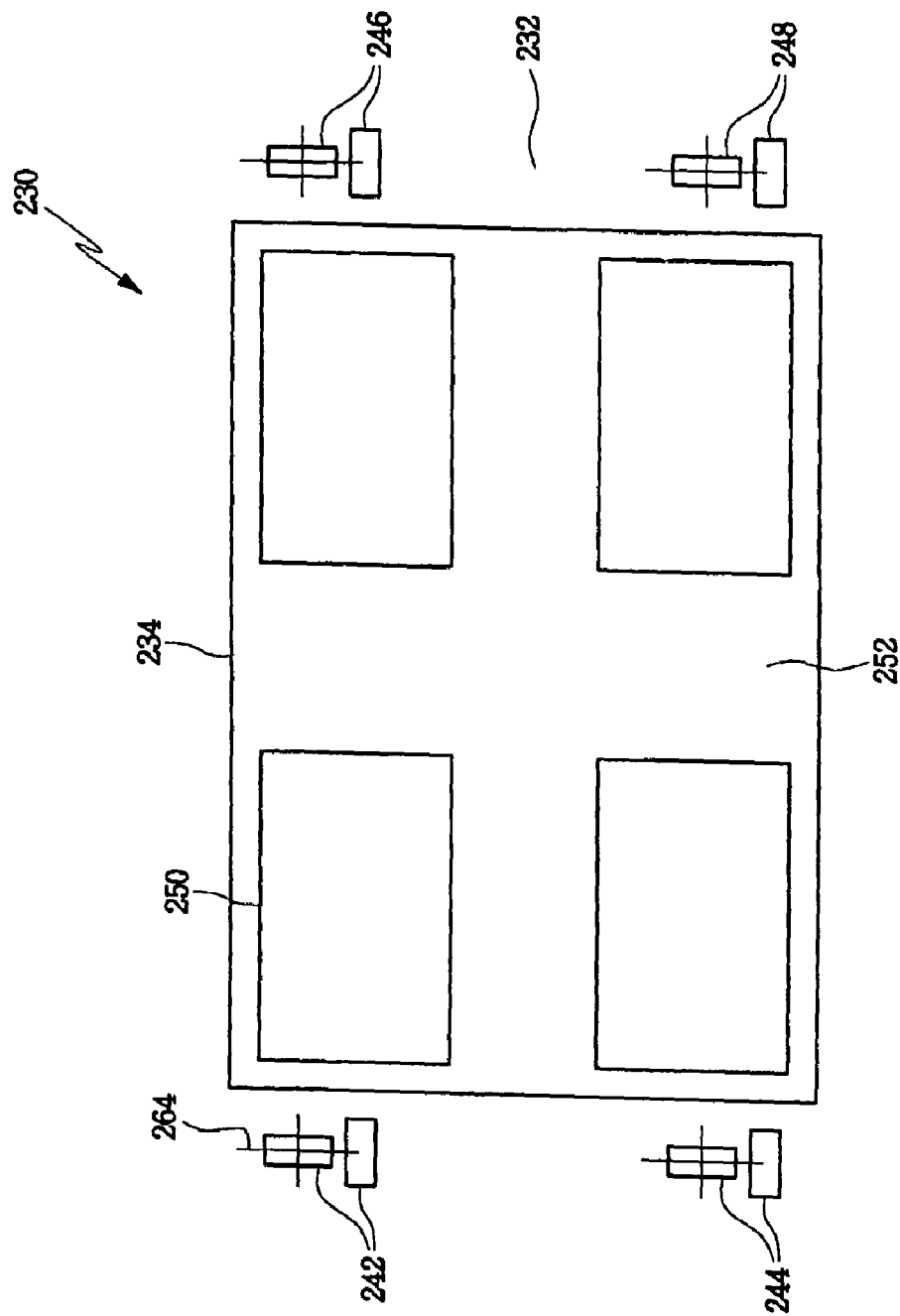
FIG. 4 is a plan view of a chip at region A of the semiconductor substrate shown in FIG. 3, illustrating the chip alignment step according to the invention.
Figure 5:
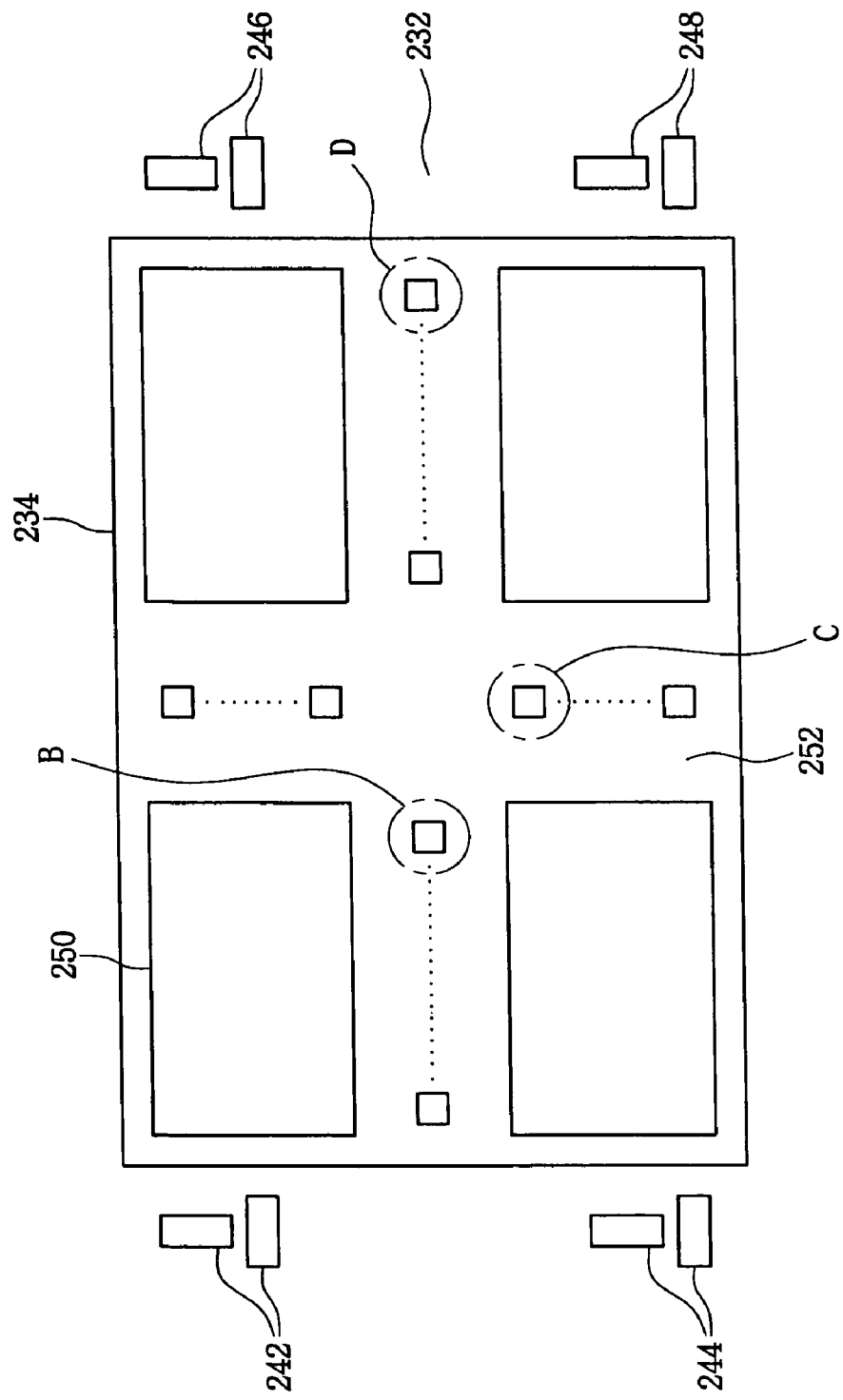
FIG. 5 is a plan view of the chip, illustrating one aspect of the semiconductor substrate alignment step according to the invention.
Figure 6:
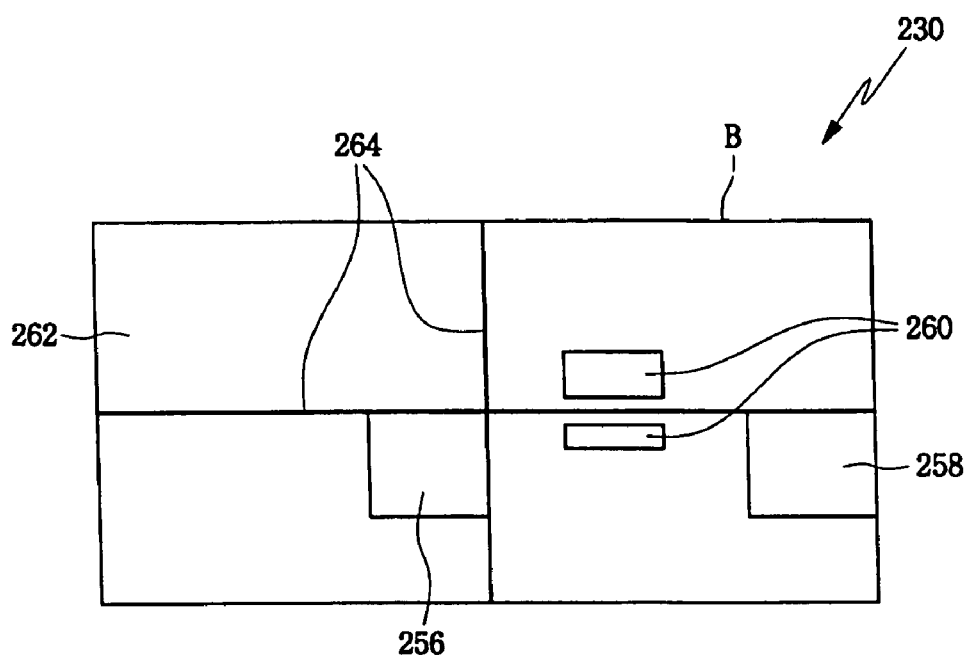
FIG. 6 is a plan view of region B of the chip shown in FIG. 5.
Figure 7:
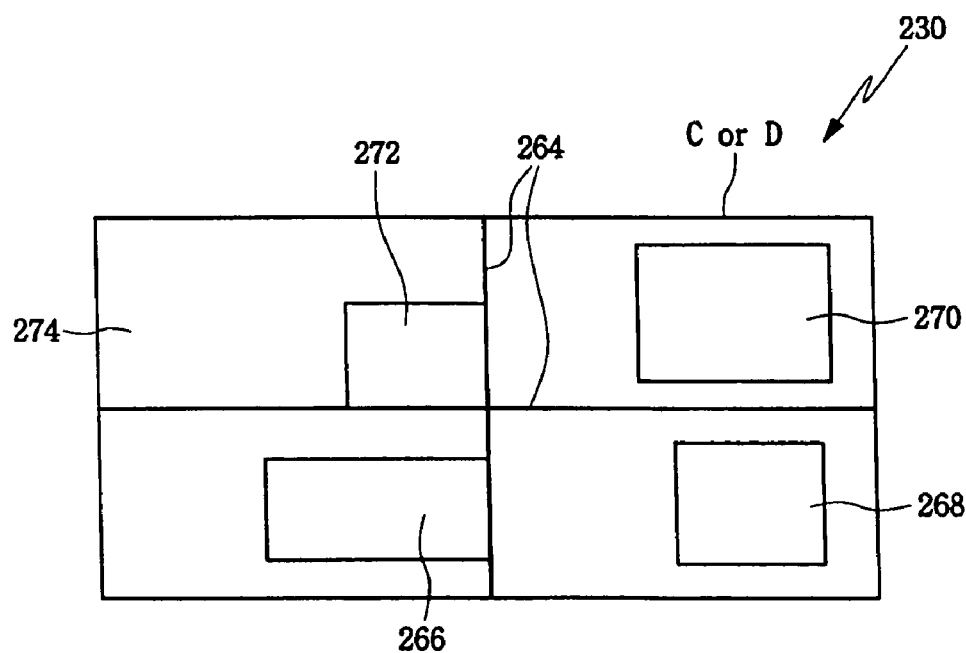
FIG. 7 is a plane view of region C or D of the chip shown in FIG. 5.

Referring to FIG. 4, the alignment ruler 264 of the checker is overlapped with the respective keys 242, 244, 246 and 248 formed on the scribe line 232 around the central chip 234. The central chip 234 includes a plurality of memory regions 250 and a peripheral circuit region 252. At this time, the semiconductor alignment apparatus determines the positions of the keys 242, 244, 246 248 relative to the alignment ruler as a distribution of numerical values ("overlapping values"). The alignment apparatus uses the overlapping values to decide whether the center of the central chip 234 coincides with the center of the chuck (wafer stage) of the semiconductor alignment apparatus. The decision is based on whether 3σ of the distribution of the numerical values is within a permissible predetermined range (+/− an acceptable value). If so, the chip alignment step is deemed complete. However, if the overlapping level value is outside of the permissible range, the process is repeated until 3σ of the distribution of the overlapping values falls within the permissible range.

The semiconductor alignment step will now be described with reference to FIGS. 5–8. After the chip alignment step 120 is completed, at least two of the templates 256, 258, 260, 266, 268, 270 and 272 in the central chip 234 are selected by the checker, and images and coordinates of the at least two templates are stored in the semiconductor alignment apparatus. The templates 256, 258, 260, 266, 268, 270 and 272 are patterns which are formed in the central chip 234. The templates 256, 258, 260, 266, 268, 270 and 272 may be formed in the memory regions 250 or in the peripheral circuit region 252. However, the checker can generally find the templates 256, 258, 260, 266, 268, 270 and 272 more easily in the peripheral circuit region 252 than in the memory regions 250.

The checker is moved to one part of the central chip 234 (region B in FIG. 5) to focus on one of several patterns 256, 258 and 260 in region B. That is, one pattern (i.e., template) 256 is selected by the checker to align the center of the alignment ruler 264. And, an image and coordinates of the template 256 are stored in the semiconductor alignment apparatus. The template 256 is, in general, a pattern that possesses a high discriminating power, at least before the semiconductor manufacturing process takes place.

Next, the checker is moved to another part of the central chip (region C or D) to focus on one of the patterns 266, 268, 270 and 272 formed in that region. That is, one pattern (i.e., template) 272 is selected by the checker to align the center of the alignment ruler 264. And, the image and coordinates of the template 272 are stored in the semiconductor alignment apparatus. Accordingly, data of at least two templates 256 and 272 are stored in the semiconductor alignment apparatus.

The use of at least two templates, namely templates 256 and 272, can reduce the probability of an alignment failure between the semiconductor alignment apparatus and the semiconductor substrate 230. If an alignment failure occurs during the semiconductor manufacturing or test process due to the template 256 of the central chip 234, the semiconductor alignment apparatus may use the template 272 of the central chip 234 instead.

Figure 8:
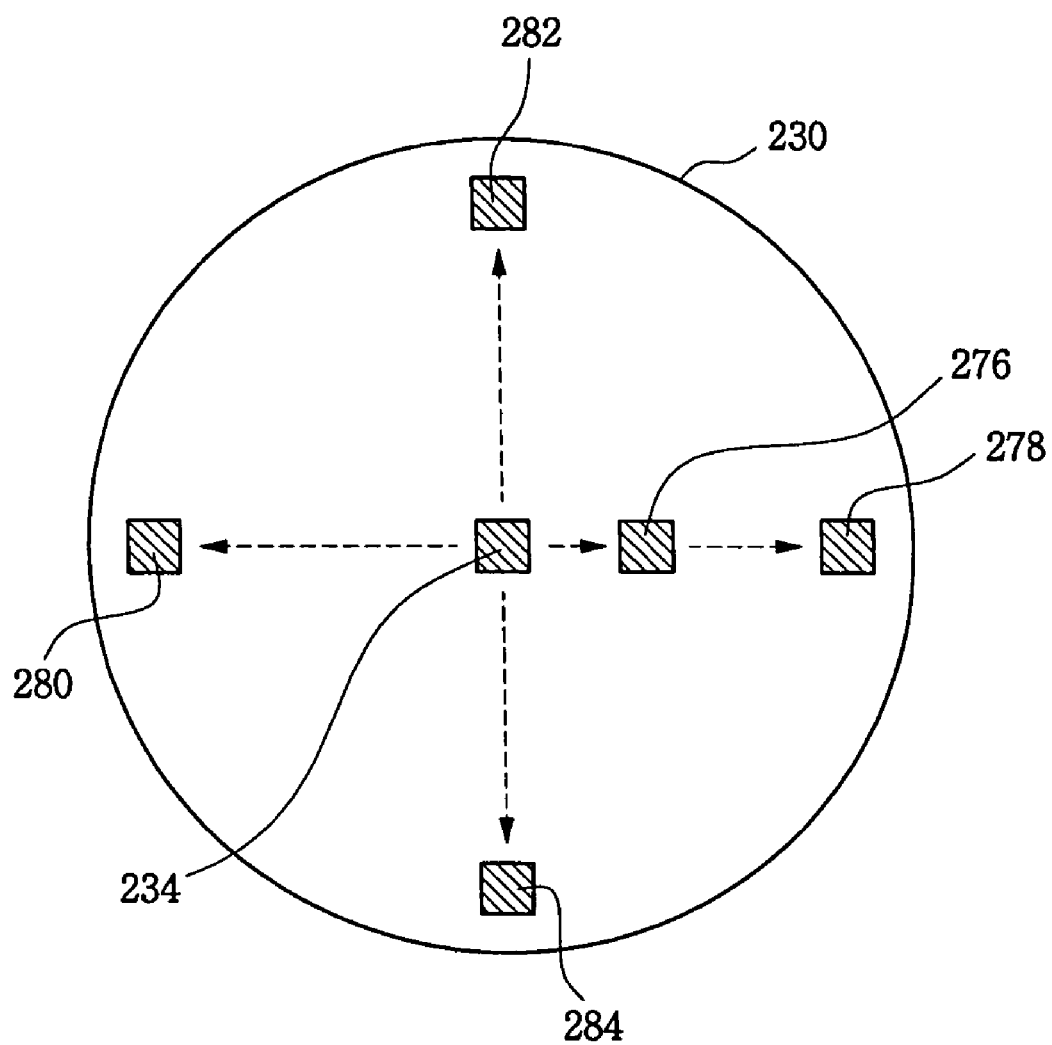
FIG. 8 is a plan view of a semiconductor substrate, illustrating another aspect of the semiconductor substrate alignment method according to the invention.

Referring to FIG. 8, the semiconductor substrate 230 is moved to locate the checker of the semiconductor alignment apparatus on a chip 276 adjacent to the central chip 234 on the semiconductor substrate 230, and to obtain coordinates of the center of the chip 276. Also, the respective coordinates of the center of the chip 276 and the coordinates of the center of the central chip 234 are compared to obtain a value used to correct deviations of the semiconductor substrate 230 in rotational or lateral/longitudinal directions. That is, the correction value is added to the coordinates of the center of the chip 276 to provide data used to correct the location of the semiconductor substrate 230. Next the semiconductor substrate 230 is moved laterally/longitudinally to obtain coordinates of the respective centers of chips 278, 280, 282 and 284 in the peripheral region of the substrate. Again, coordinates of the centers of the chips are compared with the coordinates of the center of the central chip 234, and the comparisons are used to provide correction data, i.e., data used to correct the location of the semiconductor substrate 230 relative to the semiconductor manufacturing or test equipment. Accordingly, the semiconductor substrate 230 is aligned based on this correction data to undergo the semiconductor manufacturing or test process.

Figure 2:
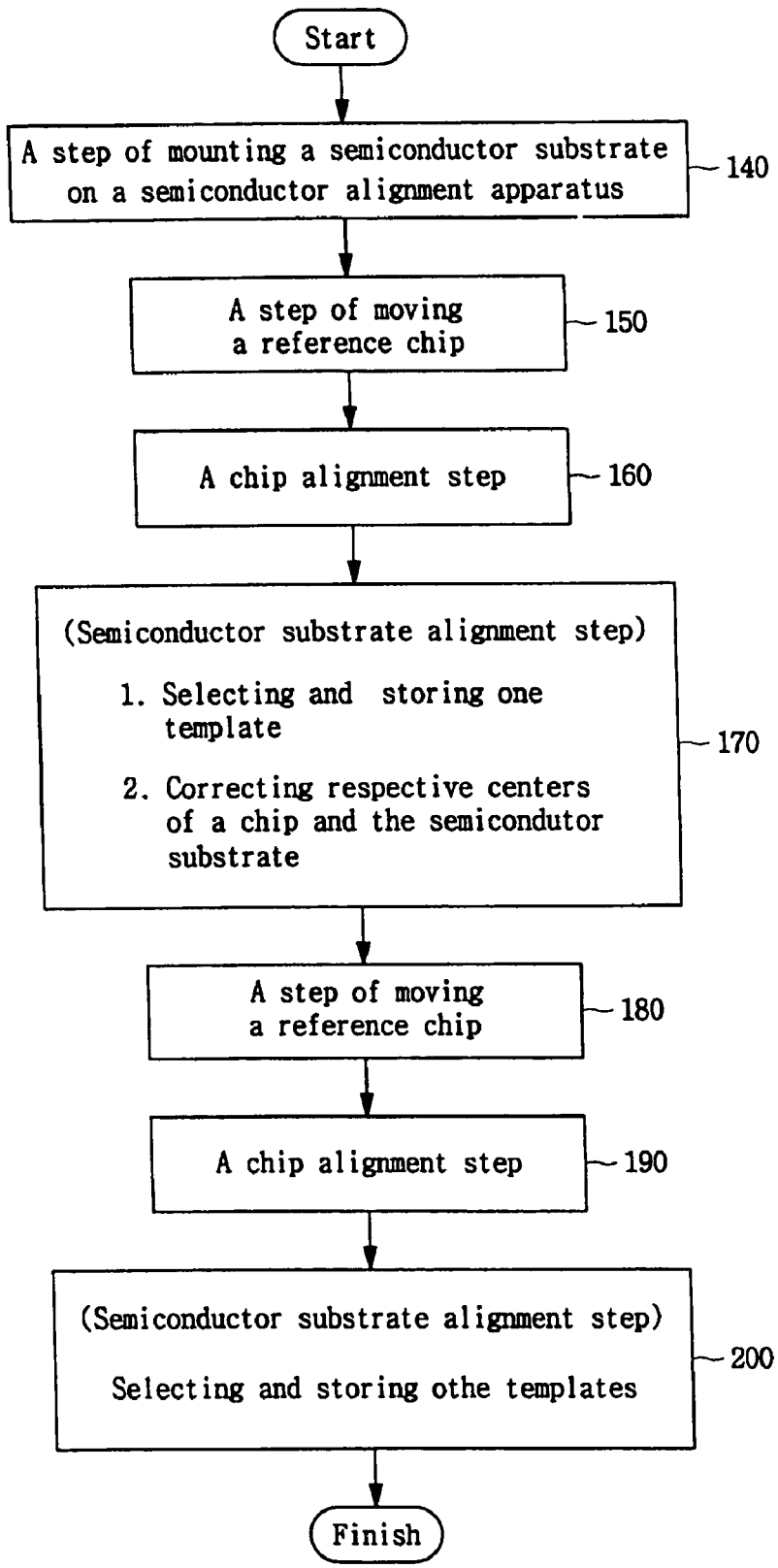
FIG. 2 is a flow chart of a second embodiment of a method of aligning a semiconductor substrate according to the present invention.

In the embodiment of FIG. 2, only an image and coordinates of one template, e.g., template 256, is stored in the semiconductor alignment apparatus during the semiconductor substrate alignment 170. This step 170 follows a step 140 of mounting a semiconductor substrate on the chuck (wafer stage) of the semiconductor alignment apparatus, a step 150 of moving the checker to a reference (central) chip, and a chip alignment step 160. The steps 180, 190 and 200 of the embodiment shown in FIG. 2 may be performed with respect to the central chip 234 and the semiconductor substrate 230. In these steps, the checker selects templates adjacent to the template 256 and stores images and coordinates of the templates in the semiconductor alignment apparatus.

More specifically, the semiconductor substrate alignment step 170 comprises selecting one template on the central chip 234 on the semiconductor substrate 230, storing the image and coordinates of the central chip 234 in the semiconductor alignment apparatus, and correcting positional data pertaining to the central chip and the center of the semiconductor substrate. And a step 180 of moving to the reference chip on the semiconductor substrate, and a chip alignment step 190 are performed. After the chip alignment step 190 is completed, there is performed a semiconductor substrate alignment step 200. The semiconductor substrate alignment step 200 further selects other templates adjacent to the one template. And the correction of respective centers of the chip and the semiconductor substrate is not performed. This is because the correction is already performed through the semiconductor substrate alignment step 170. Images and location coordinates of the other templates are stored in the semiconductor alignment apparatus. The alignment between the semiconductor substrate and the semiconductor alignment apparatus is entirely completed.

As described hereinabove, the method of the present invention comprises storing the images and the coordinates of at least two templates during the process of deriving the database that will be used by the semiconductor alignment apparatus to align the semiconductor substrate with semiconductor manufacturing or semiconductor test equipment. If one of the templates can not be read during the course of the semiconductor manufacturing or semiconductor test process, the other template(s) can be used. Therefore, there is little probability of an alignment failure occurring. As a result, the invention is capable of minimizing the unit cost of the chips.

Although the present invention has been particularly shown and described with reference to the preferred embodiments thereof, variations of the preferred embodiments will become apparent to those skilled in the art. Thus, changes in form and details may be made to the disclosed embodiments without departing from the spirit and scope of the invention as defined by the following claims.

What is claimed is:

1. A method of defining the relative locations of chips on a semiconductor substrate for use in aligning the chips with semiconductor processing or test equipment, comprising:

mounting the semiconductor substrate on a stage of a semiconductor alignment apparatus;

performing a chip alignment comprising obtaining reference coordinates of the central chip on the substrate, and determining whether the substrate is acceptably centered on the stage on the basis of the reference coordinates;

subsequently performing a semiconductor substrate alignment in which data of the relative state of alignment between the substrate and the alignment apparatus is produced, said semiconductor substrate alignment comprising locating at least two templates in the central chip with a checker of the semiconductor alignment apparatus, each of the templates comprising a pattern discernible by an imaging device of the checker, capturing the images of the at least two templates with the imaging device, and storing the images and reference coordinates of the at least two templates, and deriving coordinates of the chips relative to the semiconductor alignment apparatus.

2. The method according to claim 1, wherein the chip alignment comprises sequentially juxtaposing an alignment ruler of the checker with respective keys disposed around the central chip on the semiconductor substrate, and determining whether values derived from the juxtaposing of the alignment ruler and the respective keys fall within a permissable range.

3. The method according to claim 1, wherein the semiconductor substrate alignment comprises using the checker to obtain reference coordinates of a chip adjacent to the central chip, comparing the coordinates of the central chip and the adjacent chip to obtain a correction value that represents a deviation of the substrate in rotational direction or lateral/longitudinal directions, and adding the correction value to the reference coordinates of the adjacent chip, moving the semiconductor substrate longitudinally/laterally relative to the checker to obtain reference coordinates of chips located in the peripheral region of the semiconductor substrate, and adding the correction value to the respective reference coordinates of the chips located in the peripheral region of the semiconductor substrate.

4. The method according to claim 1, wherein only the image of the at least two templates is captured and stored before the coordinates of the chips relative to the semiconductor alignment apparatus are derived.

5. The method according to claim 1, wherein the images of the at least two templates are captured and stored before the coordinates of the chips relative to the semiconductor alignment apparatus are derived.

6. The method according to claim 1, wherein the respective templates are used to produce the data of the relative state of alignment between the substrate and the alignment apparatus.

* * * * *